(12) United States Patent
Takeuchi et al.

(10) Patent No.: US 11,765,817 B2
(45) Date of Patent: Sep. 19, 2023

(54) CONTROL DEVICE AND MANUFACTURING METHOD OF CONTROL DEVICE

(71) Applicant: Mitsubishi Electric Corporation, Tokyo (JP)

(72) Inventors: Yutaka Takeuchi, Tokyo (JP); Hideyuki Takahama, Tokyo (JP); Yuzo Taguchi, Tokyo (JP); Shozo Kanzaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/748,608

(22) Filed: May 19, 2022

(65) Prior Publication Data
US 2022/0408553 A1 Dec. 22, 2022

(30) Foreign Application Priority Data

Jun. 21, 2021 (JP) .................. 2021-102157

(51) Int. Cl.
*H05K 1/02* (2006.01)
*H05K 1/11* (2006.01)
(Continued)

(52) U.S. Cl.
CPC ........... *H05K 1/0275* (2013.01); *H05K 1/112* (2013.01); *H05K 1/186* (2013.01); *H05K 3/0005* (2013.01);
(Continued)

(58) Field of Classification Search
CPC ........ H05K 1/02; H05K 1/0275; H05K 1/112; H05K 1/186; H05K 3/0005; H05K 3/4644
(Continued)

(56) References Cited

U.S. PATENT DOCUMENTS

| | | |
|---|---|---|
| 2005/0081049 A1 | 4/2005 | Nakayama et al. |
| 2014/0027930 A1 | 1/2014 | Hosomi |
| 2016/0224811 A1 | 8/2016 | Kawashima |

FOREIGN PATENT DOCUMENTS

| | | |
|---|---|---|
| JP | 2005-136391 A | 5/2005 |
| JP | 2006-18577 A | 1/2006 |

(Continued)

OTHER PUBLICATIONS

Communication dated Sep. 6, 2022, issued in Japanese Application No. 2021-102157.

*Primary Examiner* — Tremesha S Willis
(74) *Attorney, Agent, or Firm* — Sughrue Mion, PLLC; Richard C. Turner (57) ABSTRACT

An object here is to provide a control device which can be reduced in size, weight and cost while being able to prevent unauthorized access. The control device includes: a microcontroller having a storage device, a processor, a package in which the storage device and the processor are accommodated, and multiple communication electrodes provided on a bottom surface of the package; and a wiring board having wiring layers comprised of a front surface layer, an intermediate layer and a rear surface layer, each having a wiring pattern formed therein, insulating members for insulating the respective wiring layers from each other; interlayer connection portions each making an electrical connection between the wiring patterns in different ones of the wiring layers; multiple electrode pads formed n the front surface layer; and communication-dedicated interlayer connection portions which are electrically connected to the respective electrode pads, and which are each externally exposed.

16 Claims, 6 Drawing Sheets

(51) Int. Cl.
*H05K 3/46* (2006.01)
*H05K 1/18* (2006.01)
*H05K 3/00* (2006.01)

(52) U.S. Cl.
CPC . *H05K 3/4644* (2013.01); *H05K 2201/09509* (2013.01)

(58) Field of Classification Search
USPC .......................................................... 174/34
See application file for complete search history.

(56) References Cited

FOREIGN PATENT DOCUMENTS

| | | |
|---|---|---|
| JP | 2014-27145 A | 2/2014 |
| JP | 2016-51889 A | 4/2016 |

CONTROL DEVICE AND MANUFACTURING METHOD OF CONTROL DEVICE

TECHNICAL FIELD

The present application relates to a control device and a manufacturing method of the control device.

BACKGROUND

On-vehicle control devices take control on the basis of control programs that are written in storage devices of their microcontrollers mounted on wiring boards. After production and sale of vehicles, in some cases, the control program is updated for-improvement or upgrade thereof. In these cases, rewriting of the control program (reprogramming) is executed. Meanwhile, when a trouble has occurred in the operation of the vehicle, in some cases, information related to the operational condition at the occurrence of the trouble is recorded in the storage device and the recorded information is then externally read out and subjected to analysis.

In order to achieve such functions, in the control device, the storage device is provided which serves to store the program and to record the information related to the operational condition. Further, in the control device, there are provided communication terminals for making access to the storage device for the purpose of rewriting the program and reading out the recorded information. The communication terminals are connected to the diagnosis connector of the vehicle. By the use of the diagnosis connector of the vehicle, the storage device is accessed by the manufacturer, the distributor or the maintenance dealer of the vehicle. Functions like the above are applicable not only to an on-vehicle control device, but also to other control devices in a variety of fields, such as, an on-plane control device, an on-ship control device, a control device for an elevator or escalator, a control device for building maintenance, a control device for an office machine, a control device for a home electrical appliance, and the like.

The diagnosis connector attached to the vehicle is a well-known connector. Accordingly, there is a risk that unauthorized access may be made by a person other than the authorized manufacturer, distributor and maintenance dealer of the vehicle. Further, in the microcontroller mounted on the wiring board of the control device, communication electrodes for making access to the internal storage device is frequently provided. Thus, it is also conceivable that, without through the diagnosis connector, access is made directly to the electrodes of such an electronic component to thereby acquire the information or rewrite the program. When the control program is rewritten due to unauthorized access, there arises a problem of causing an unexpected trouble in the vehicle. In addition, a case may be assumed where control of the vehicle is taken over by a remote operation and thus, there is conceivable a risk of infringement of property rights, reduction in operation rate (reduction in operation availability), leakage of personal information, or the like. It is thought that such damages may occur over a wide range of fields that are assumed as those in so-called SFOP (Safety Financial Operational Privacy). Further, the control program might be extracted from the storage device and then replicated.

At the time of communication, in order to enhance the security, password-based access restriction is imposed so that unauthorized access is pr Tented. However, such a simple password management becoming insufficient as a measure against unauthorized access.

For that reason, there is proposed a method in which a physical access barrier is created to thereby enhance the security.

There is further proposed a technique in which, in the control device, the communication terminals to be connected to the diagnosis connector used for rewriting the program or reading out the recorded information, are eliminated to thereby prevent unauthorized access from the outside. Further, the electrodes of the electronic component such as the microcontroller mounted to the wiring board of the control device, are not externally exposed so that it is difficult to directly access the electrodes of the electronic component. The storage device in the control device is made accessible through a publicly-undisclosed connection spot dedicated to special communication, and this makes it possible to rewrite the program for the control device and to read out the recorded information (see, for example, Patent Document 1).

CITATION LIST

Patent Literature

Patent. Document 1: Japanese Patent Application Laid-open No.2005-136391

According to the technique disclosed in Patent Document 1, the electronic component such as the microcontroller of the control device is enclosed in a wiring board, so that a connection terminal and a signal line to be kept secret are not externally exposed. This makes it possible to prevent unauthorized access. Note that, the secret signal is made measurable only at such a special measurement point. However, according to this technique, it is necessary to enclose in the wiring board the electronic component such as the microcontroller. This hinders the wiring board from being reduced in thickness, and the control device from being reduced in size, weight and cost.

SUMMARY

This application has been made to solve the problem as described above. An object thereof is to provide a control device which can be reduced in size, weight and cost while being able to prevent unauthorized. access, in a situation where a microcontroller provided. with communication electrodes for making access to its storage device is mounted on a wiring board included in the control device.

In another aspect, an object of this application is to provide a manufacturing method of a control device for solving the problem as described. above, said control device capable of being reduced in size, weight and cost while being able to prevent unauthorized access, a situation where a micro-controller provided with communication electrodes for making access to its storage device is mounted on a wiring board included in the control device.

Solution to Problem

A control device according to this application comprises: microcontroller having, a storage device; a processor for processing information on a basis of a program stored in the storage device; a package in which the storage device and the processor are accommodated; and multiple communication electrodes which are provided on a bottom surface of the package, for allowing access from an outside of the package to the storage device; and a wiring board having, wiring layers which are comprised of front surface layer, an intermediate layer and a rear surface layer, each having a wiring pattern formed therein; insulating members for insulating the respective wiring layers from each other; interlayer connection portions each making an electrical connection between the wiring pattern and the other wiring pattern in different ones of the wiring layers; multiple electrode pads which are formed in the front surface layer and to which the respective communication electrodes of the microcontroller are connected; and communication-dedicated interlayer connection portions which are electrically connected, each through the wiring pattern, to the respective electrode pads, which are located to be spaced apart from each other, and which are each externally exposed on at least one of front and rear surfaces of the wiring board.

A manufacturing method of a control device according to this application comprises: a first step o preparing a microcontroller having, a storage device; a processor for processing formation on a basis of a program stored in the storage device; a package which is provided with indication of a type name and in which the storage device and the processor are accommodated;

and multiple communication electrodes which are provided on bottom surface of the package, for allowing access from an outside of the package to the storage device;

a second step of preparing a wiring board having, wiring layers which are comprised of a front surface layer, an intermediate layer and a rear surface layer, each having a wiring pattern formed therein; insulating members for insulating the respective wiring layers from. each other; interlayer connection portions each making an electrical connection between the wiring pattern and the other wiring pattern in different ones of the wiring layers; multiple electrode pads which are formed in the front surface layer and to which the respective communication electrodes of the microcontroller are to be connected; and communication-dedicated interlayer connection portions which are electrically connected, each through the wiring pattern, to the respective electrode pads, which are located to be spaced apart from each other, and which are each externally exposed on at least one of front and rear surfaces of the wring board;

a third step of joining the microcontroller to the wiring board; and a fourth step of processing the indication of the type name on the package of the microcontroller, into an unreadable state.

Advantageous Effects

According to the control device and the manufacturing method of the control device in accordance with this application, it is possible to provide a control device which can be reduced in size, weight and cost while being able to prevent unauthorized access, in a situation where a microcontroller provided with communication electrodes for making access to its storage device is mounted on a wiring board included in the control device.

DESCRIPTION OF EMBODIMENTS

Hereinafter, embodiments of the control device according to this application will be described with reference to the drawings.

1. Embodiment 1

<Configuration of Control Device>

Figure 1:
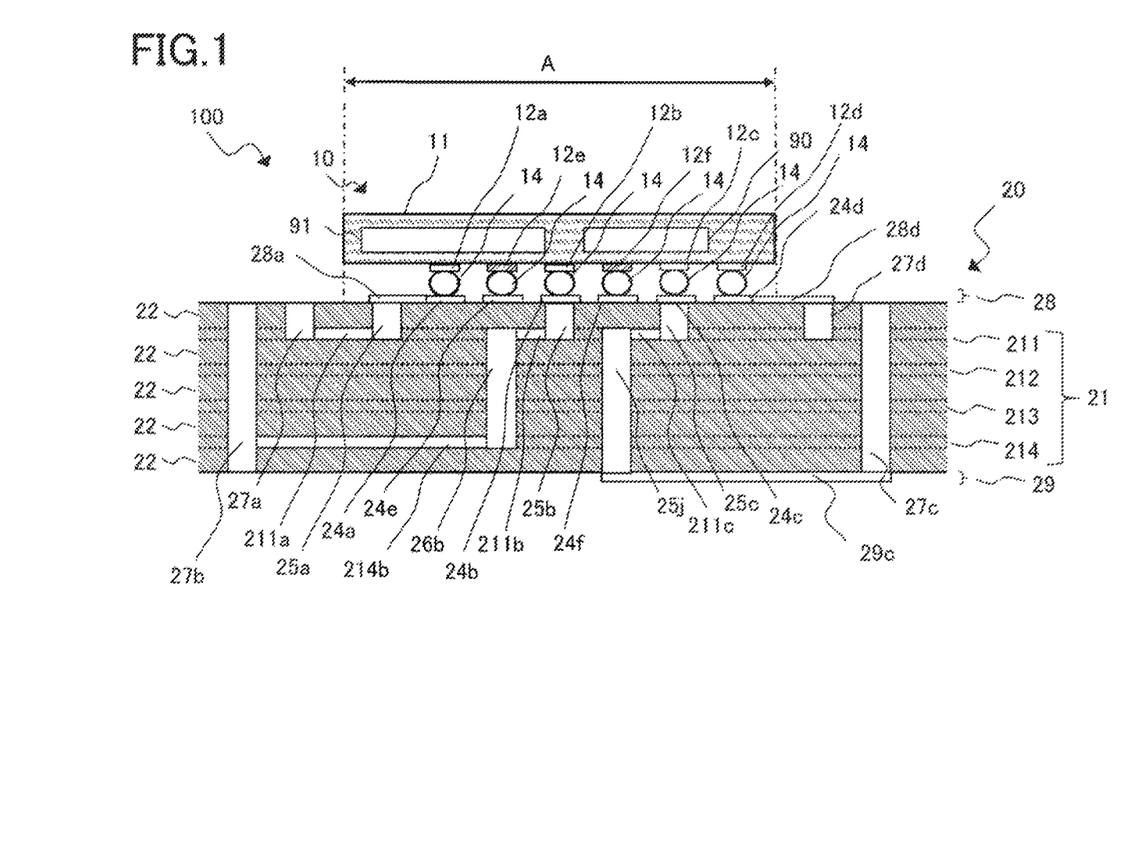
FIG. 1 is a sectional view of a control device according to Embodiment 1.
Figure 2:
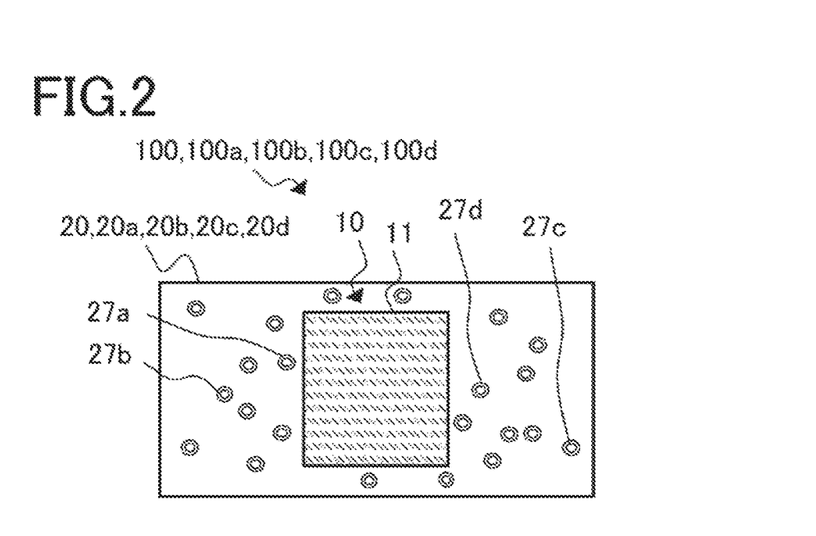
FIG. 2 is a top view of the control device according to Embodiment 1.

FIG. 1 is a sectional view of a control device 100 according to Embodiment 1. In FIG. 1, there is shown a sectional view of a wiring board 20 on which a microcontroller 10 having a package 11 is mounted. FIG. 2 is a top view of the control device 100 according to Embodiment 1. The control device 100 has a housing, connectors, power supply components, an interface circuit, etc.; however, in FIG. 1 and FIG. 2, indication thereof is omitted. The wiring board 20 is indicated partially in FIG. 1 and FIG. 2. FIG. 2 may be employed not only for the control device 100, but also for control devices 100a, 100b, 100c and 100d, to be described later.

The control device 100 is mounted on a vehicle and is used for engine control, transmission control, brake control, electric power-steering control, motive power motor control or automatic driving control, for example. The applicable scope of the control device 100 is not limited thereby, and the control device may be applied as another control device in a variety of fields, such as, an on-plane control device, an on-ship control device, a control device for an elevator or escalator, a control device for building maintenance, a control device for an office machine, a control device for a home electrical appliance, or the like.

<Wiring Board>

The wiring board 20 is a multi-layer board having wiring layers which are comprised of a front surface layer 28, a rear surface layer 29 and an intermediate layer 21 sandwiched between the front surface layer 28 and the rear surface layer 29, each having a wiring pattern formed therein. A metal foil or metal film made of a conductive material such as a copper, a silver or the like, is used for the wiring pattern placed in the wiring layer. In FIG. 1, the intermediate layer 21 is composed of four wiring layers of a first intermediate layer 211, a second intermediate layer 212, a third intermediate layer 213 and a fourth intermediate layer 214. The wiring board 20 has six wiring layers and is thus called a six-layer board. It is not specifically required that the wiring board 20 according to Embodiment 1 be a six-layer board, and it suffices that the wiring board be a three or more multi-layer board having an intermediate layer.

The respective wiring layers are insulated from each other by insulating members 22. The insulating members 22 are also called a substrate of the wiring board 20 and thus serve also as a structural body for holding the structure of the wiring board 20. For the substrate, an epoxy resin with a reinforcing material such as a paper, a glass fiber or a glass non-woven fabric; an alumina-containing ceramic; an insulated metal material; or the like, is used. The wiring board 20 may be called a Printed Circuit Board (PCB), and is fabricated using steps such as a printing step, an etching step, a plating step, a vapor deposition step, and the like.

In FIG. 1, wiring patterns 28a, 28d, 29c, 211a, 211b, 211c, 214b are placed in the respective wiring layers of the wiring board 20. In order to electrically connect the wiring patterns in certain wiring layers insulated by the insulating member(s) 22, with each other beyond that insulating member(s) 22, an interlayer connection portion is formed. In order to electrically connect the wiring patterns in these wiring layers of the wiring board 20 with each other, a hole is created in the insulating member (s) and the wall surface of the hole is subjected to coating of a conductive material or plating of a condictive material, so that an electrical connection between the wiring pattern is established. The interlayer connection portion is generally referred to as a through-hole or a via (referred also as a via hole). In particular, the through-hole is frequently used as a hole for soldering an electronic component by inserting its terminal in that hole. As distinguished from the through-hole, the via means a hole in which no terminal of an electronic component is inserted and which is made only for the purpose of establishing electrical conduction between wiring layers.

A via which penetrates entirely from the front surface layer 28 to the rear surface layer 29 in the wiring board 20 is referred to as a through-hole via. Indicated at 27b, 27c in FIG. 1 are each the through-hole via. A via which is insulated through the insulating member 22 from at least one of the wiring layers is referred to as a bind via. It is a via which partially penetrates in the wiring board 20. In FIG. 1, indicated at 25a, 25b, 25c, 25j, 26b, 27a, 27d are blind vias. Among the blind vias, a via which makes electrical connection only between the intermediate layers in the wiring layers is referred to as a buried via. Since the buried via is not connected to the front surface layer 28 and the rear surface layer 29 of the wiring board 20, it cannot be visually recognized from the front side and the rear side. In order to form the buried via, it is required that the wiring board 20 have four or more wiring layers. In FIG. 1, indicated at 26b is the buried via.

FIG. 2 is a top view of the control device 100 viewed from the top side thereof, in which the top surface of the microcontroller 10 is shown. There are indicated the vias positioned in the area of the front surface layer 28 of the wiring board 20 shown in FIG. 2; however, indication of the wiring pattern here is omitted. Around the microcontroller 10, communication vias 27a, 27b, 27c, 27d of the wiring board 20 are shown.

The microcontroller 10 is provided with communication electrodes 12a, 12b, 12c, 12d and electrodes 12e, 12f formed on the bottom surface thereof, which are respectively connected, using conductive materials 14, to electrode pads 24a, 21h, 24c, 24d, 24e, 24f formed by processes similar to those for the wiring pattern in the front surface layer 28 of the wiring board 20. As the conductive material 14, a solder, silver paste or the like is used.

<Hardware Configuration of Microcontroller>

Figure 3:
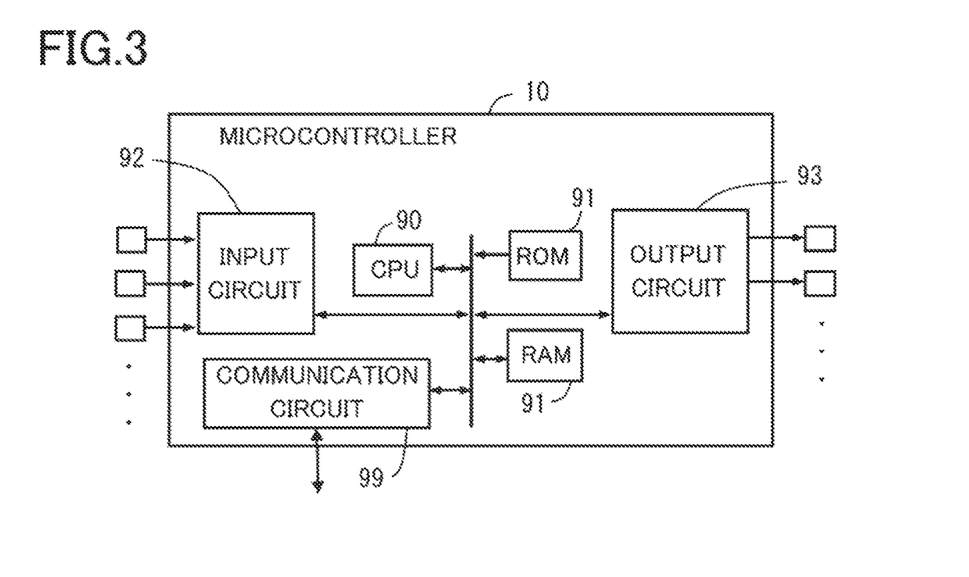
FIG. 3 is a hardware configuration diagram of microcontroller in the control device according to Embodiment 1.

In FIG. 3, a hardware configuration diagram of the microcontroller 10 in the control device 100 according to Embodiment 1 is shown. In this Embodiment, the micro controller 10 is an information processing device mounted on the wiring board 20 of the control device 100 for the vehicle. The respective functions of the microcontroller 10 are implemented by a processing circuit included in the microcontroller 10. Specifically, the microcontroller 10 includes as the processing circuit an arithmetic processing device 90 (referred to also as a processor) such as a CPU (Central Processing Unit) or the like, storage devices 91 for transmitting/receiving data to/from the arithmetic processing device 90, an input circuit 92 for inputting an external signal to the arithmetic processing device 90, an output circuit 93 for outputting a signal from the arithmetic processing device 90 to the outside, etc.

As the arithmetic processing device 90, there may be included an ASIC (Application Specific integrated Circuit), an IC (Integrated Circuit), a DSP (Digital Signal Processor), an FPGA. (Field Programmable Gate Array), any one of a variety of logic circuits, any one of a variety of signal processing circuits, or the like. Further, as the arithmetic processing device 90, there may be included multiple such circuits of the same type or different types, and thus, the respective parts of processing may be executed separately. As the storage devices 91, a RAM (Random Access Memory) that is configured to allow reading and writing of data by the arithmetic processing device 90, a ROM (Read Only Memory) that is configured to allow reading of data by the arithmetic processing device 90, etc are included. As the storage device 91, a non-volatile or volatile semiconductor memory, such as a flash memory, an EPROM, an EEPROM or the like, may be used. The input circuit 92 is connected to a variety of sensors, switches and communication lines that are allocated to electrodes of the microcontroller 10, and is provided with an A-D convertor, a communication circuit, etc. for inputting output signals and communication information from these sensors and switches, to the arithmetic processing device 90. The output circuit 93 is an interface circuit for outputting a control signal from the arithmetic processing device 90. A communication unit 99 in the microcontroller 10 has a function of communicating with an external apparatus through the arithmetic processing device 90 or without through the arithmetic processing device 90.

The respective functions that the micro-controller 10 includes, are implemented in such a manner that the arithmetic processing device 90 executes software (programs) stored in the storage device 91 as the ROM or the like, to thereby cooperate with the other hardware in the microcontroller 10, such as, the other storage device 91, the input circuit 92, the output circuit 93, etc. Note that the set data of threshold values, determination values and the like to be used by the microcontroller 10 is stored, as a part of the software (programs), in the storage device 91 as the ROM or the like. While the respective functions that the microcontroller 10 has, may be established each solely by a software module, it may be established by a combination of software and hardware.

When the arithmetic processing device 90 is that which executes the programs stored in an external memory placed outside the microcontroller 10, the functions of the microcontroller 10 may be implemented by software of such a type that loads the programs to be executed by the processing circuit from the external memory into the RAM. Further, the program may be in the form of firmware fixed to the ROM. Instead, the program may be established by the combination of both software and firmware.

The microcontroller 10 here is assumed to be a one-chip microcomputer, an ASIC, an FPGA or the like, in which the arithmetic processing device 90, the storage device 91, the input circuit 92, the output circuit 93 and a peripheral circuit such as a clock, counter, an A-D converter, etc are encapsulated in single package. This is because, if a product is a mass-produced and commercially available product, it is available at relatively low cost. However, the microcontroller may be realized not by such a commercially available ready-made product, but by a special-order (so-called custom-made) integrated circuit for a particular customer which is encapsulated in a single package by using a SoC (System on a Chip) technology or a SiP (System in a Package) technology.

The microcontroller 10 is provided with a function of accessing the storage device 91 without being restricted by the programs included in the storage device 91. The content of the storage device 91 can be read out therefrom or can be written therein when the communication unit 99 makes communication through the communication electrodes 12a, 12b, 12c, 12d connected to the inside of the microcontroller 10. Here, it is assumed that such a function is provided according to a system based on ail integrated-circuit test specification in accordance with the standard (Standard IEEE 1149.1, etc.) defined by JTAG (Joint Test Action Group) that is an industry organization of electronics. However, the function may be provided according to an original communication system defined differently from that standard.

<Package of Microcontroller>

On the bottom surface of the package 11 of the microcontroller 10, there are provided the communication electrodes 12a, 12b, 12c, 12d, the electrodes 12a, 12f, and the like. The use of such a package that may be referred to as a BGA (Ball Grid Array) or LGA (Land Grid Array) package, makes it possible to mount the microcontroller 10 with a high density on the wiring board 20. Further, since the communication electrodes 12a, 12b, 12c, 12d, the electrodes 12e, 12f and the like, are provided on the bottom surface of the package 11, it is difficult co access these electrodes of the microcontroller 10 from the outside. Furthermore, it is difficult to visually recognize which electrode of the microcontroller 10 is connected to which wiring pattern of the wiring board 20.

There are cases where the microcontroller 10 is a semiconductor product generally available in the market, and the positions of the communication electrodes 12a, 12b, 12c, 12d for making access to the internal storage device 91 are publicly disclosed. Even in these cases, if it is unknown which electrode of the microcontroller 10 is to be connected to which wiring pattern of the wiring board 20, it is difficult to determine how to connect the communication electrodes 12a, 12b, 12c, 12d. This is because, on the wiring board 20, wirings for making access to the respective communication electrodes 12a, 12b, 12c, 12d are difficult to be ascertained.

<Wiring Patterns of Wiring board>

In FIG. 1, the communication electrode 12a, 12b, 12c, 12d are fixed, using the conductive materials 14, to the electrode pads 24a, 24b, 24c, 24d in the front surface layer 28 of the wiring board 20, respectively. The electrode pads 24a, 24b, 24c, 24d are electrically connected to communication-dedicated interlayer connection portions (communication vias) 27a, 27b, 27c, 27d, respectively, through wiring patterns and the interlayer connection portions (vias). Hereinafter, description about the electrodes other than the communication electrodes 12a, 12b, 12c, 12d, namely, the electrodes 12e, 12f, and the electrode pads 24e, 24f, etc. of the wiring board 20 connected thereto, will be skipped. The microcontroller 10 has power supply electrodes, input electrodes, output electrodes and the like, other than the communication electrodes; however, in the following, description will be made only focusing on connections of the communication electrodes for making access to the internal storage device 91.

The electrode pad 24a is electrically connected through the wiring pattern 28a, the blind via 25a and the wiring pattern 211a to the communication via 27a. The electrode pad 24b is electrically connected through the blind via 25b, the wiring pattern 211b, the buried via 26b and the wiring pattern 214b to the communication via 27b. The electrode pad 24c is electrically connected through the blind via 25c, the wiring pattern 211c, the blind via 25j and the wiring pattern 29c to the communication via 27c. The electrode pad 24d is electrically connected through the wiring pattern 28d to the communication via 27d.

The communication vias 27a, 27b, 27c, 27d are externally exposed on the front surface and/or the rear surface of the wring board 20. This makes it possible for the manufacturer, the distributor or the maintenance dealer of the vehicle who understands the positions of the communication vias 27a, 27b, 27c, 27d, to access the storage device 91 in she microcontroller 10 from the outside, by making conductive terminals contact with the communication vias 27a, 27b, 27c, 27d.

<Spaced-apart. Locations of Communication Vias>

If the positions of the communication vias 27a, 27b, 27c, 27d are linearly aligned side by side on the wiring board 20, a risk arises that these vias may be presumed to be special electrodes. Thus, the communication vias are located to be spaced apart from each other, so that an unauthorized-access prevention effect is expected. In FIG. 2, an example of the positions of the communication vias 27a, 27b, 27c, 27d are shown. When their locations are spaced apart from each other and dispersed in position in this manner, the positions of the communication vias 27a, 27b, 27c, 27d are hidden, so that the unauthorized-access prevention effect is enhanced. Since the positions of the communication vias 27a, 27b, 27c, 27d are dispersed, they are not distinguishable from the other vias. This makes it difficult for a third party who cannot know beforehand the information about the locations, to identify the presence of these vias and positional relationship thereof. Accordingly, it is possible to prevent unauthorized access by a third party, without employing such an arrangement 1 which the micro-controller 10 is enclosed and encapsulated in the wring board.

According to the control device 100 in accordance with Embodiment 1, in a situation where the wiring board 20 on which the microcontroller 10 provided. with the communication electrodes 12a, 12b, 12c, 12d for making access to the storage device 91 is mounted is incorporated, it is possible to make it difficult co identify the positions of the communication vias 27a, 27b, 27c, 27d formed in the wiring board 20. This makes it possible to reduce the size, weight and cost of the control device 100 while preventing unauthorized access.

<Communication Vias Formed into Blind. Vias>

In the wiring board 20 shown in FIG. 1, the communication vias 27a, 27d are formed as blind vias each insulated through the insulating material 22 from at least one of the wiring layers. Thus, each of the communication vias 27a, 27d is externally exposed on only one of the surfaces of the wiring board 20, so that its presence cannot be visually recognized on the other surface. When at least one of the communication vias is formed as a blind via, it is possible to make it more difficult for a third party who does not know which surface of the wiring board 20 the communication vias are each exposed on, to access these communication vias. This makes it possible to increase difficulty of unauthorized access.

<Types of Communication Electrodes>

In FIG. 1, a case is shown where the respective communication vias 27a, 27b, 27c, 27d are formed as four types of communication electrodes TCK, TDI, TMS, TDO for performing communications based on JTAG standard. However, it is not required that the communication standard used here be based on JTAG standard, and if there are three types of communication electrodes, it is possible to perform communications while ensuring the reliability thereof. Thus, the communication vias to be formed may be of three types. If so formed, it is possible to reduce occupation areas of the communication vias and wiring-pattern areas up to the communication vias. This makes it possible to reduce the area of the wiring board to thereby contribute to reduction in size, weight and cost of the control device 100. Further, establishment of at least three communication vias is significant to ensure the reliability of communications.

<Pad-on-Via>

In FIG. 1, the electrode pads 24b, 24c are each provided as a pad-on-via which also serves as the interlayer connection portion (via). Accordingly, it is possible to reduce the area of the wiring pattern in the front surface layer 28 and thus to effectively utilize the area of the front surface layer 28 of the wiring board 20. This enhances the flexibility of how to arrange the wiring pattern in the front surface layer 28 of the wiring board 20. As a result, it is possible to reduce the area of the wiring board 20 to thereby contribute to reduction in size, weight and cost of the control device 100.

<Encryption of Type Name>

Here, a product type name written on the package 11 of the microcontroller 10 will be considered. In order to identify the microcontroller 10 when it is fabricated, sold or used, the package 11 of the microcontroller 10 is provided with indication of a type name thereof. When the microcontroller is a commercially-available product, by confirming the type name, it is possible to ascertain the positions of the communication electrodes for making access to the internal storage device 91. Further, even when the microcontroller 10 is not a commercially-available product widely on sale in the market and is thus a custom-made product, if it is a product whose type name is the same as that of a microcontroller whose structure has already been analyzed by reverse engineering, a case may arise that unauthorized access is easily made based on that type name.

In this case, as a way to prevent unauthorized access, it is effective to encrypt the type name to be written on the package 11 of the micro-controller 10. When, instead of a publicly disclosed type name, an encrypted type name used that is recognizable only by the manufacturer, it is possible to increase difficulty of unauthorized access.

<Modification to Unreadable Type Name>

Further, when a product type name written on the package 11 of the microcontroller 10 is processed into an unreadable state, an effect similar to the above is expected. The microcontroller 10 is joined by soldering to the wiring board 20 and is then its functional test is completed. Thereafter, the type name of the micro-controller is processed into unreadable state. This makes it possible to increase difficulty of unauthorized access.

In this case, indication of the type name may be modified into an unreadable state in such a manner that the indication portion is melted or scattered by laser processing. When the indication portion of the type name is fully or partly melted or scattered by laser processing, a mark due to laser processing is left. Even though the fact that laser processing was done may be found from a professional point of view, it suffices that the type name is modified into an unreadable state, According to laser processing, it is possible to accurately process a work piece at high speed without making direct contact therewith. Thus, laser processing is a processing method which is suitable to process the product type name into an unreadable state. if the type name becomes unreadable, i.t is not possible to ascertain the positions of the communication electrodes for making access to the internal storage device 91, so that it is difficult to make unauthorized access.

<Manufacturing Method of Control Device>

As a method of manufacturing the control device, such a manufacturing method may be employed that includes the following four steps. In the first step, the microcontroller 10 is prepared. The micro-controller 10 has: the storage device 91; the arithmetic processing unit (processor) 90 for processing information on the basis of the program stored in the storage device 91; the package 11 which is provided with indication of the type name and in which the storage device 91 and the arithmetic processing device 90 are accommodated.; and the multiple communication electrodes 12a, 12b, 12c, 12d which are provided on the bottom surface of the package 11, for allowing access from the outside of the package to the storage device 91.

In the second step, the wiring board 20 is prepared. The wiring board 20 has: the wiring layers which are comprised of the front surface layer 28, the intermediate layer 21 and the rear surface layer 29, each having a wiring pattern formed therein; the insulating members 22 for insulating the respective wiring layers from each other; the interlayer connection portions each making an electrical connection between the wiring patterns in different ones of the wiring layers; the multiple electrode pads 24a, 24b, 24c, 24d which are formed in the front surface layer 28 and to which the respective communication electrodes 12a, 12b, 12c, 12d of the microcontroller 10 are to be connected; and the communication-dedicated interlayer connection portions (communication vias) 27a, 27b, 27c, 27d which are electrically connected, each through the wiring pattern, to the respective electrode pads 24a, 24b, 24c, 24d, which are located to be spaced apart from each other, and which are each externally exposed on at least one of front and rear surfaces of the wiring board.

In the third step, the microcontroller 10 is joined by soldering, brazing or the like, to the wiring board 20. Then, in the fourth step, the indication of the type name provided on the package 11 of the micro-controller 10 is processed into an unreadable state.

By the manufacturing method having these four steps, it is possible to manufacture the control device 100. According to the control device 100 manufactured by such a manufacturing method, since the type name of the microcontroller 10 cannot be confirmed, it is not possible to ascertain the positions of the communication electrodes 12a, 12b,12c, 12d for making access to the internal storage device 91, so that it is difficult to make unauthorized access. Accordingly, in a situation where the microcontroller 10 provided with the communication electrodes 12a, 12b, 12c, 12d for making access to the storage device 91 mounted on the wiring board 20 included in the control device 100, it is possible to reduce the size, weight and cost of the control device 100 while preventing unauthorized access.

In the fourth step, as a method of processing the indication of the type name, laser processing may be employed. According to laser processing, it is possible to accurately process a work-piece at high speed without making direct contact therewith. Thus, laser processing is a processing method which is suitable to process the product type name into an unreadable state. By the laser processing, the indication portion of the type name may be fully or partly melted or scattered, so that the type name can be modified into an unreadable state.

The product type name on the package 11 of the microcontroller 10 may also be processed into an unreadable state before the microcontroller 10 is joined to the wiring board 20. It is possible to confirm the type name of the microcontroller 10 by performing communication with the microcontroller 10. Thus, in chis case, the type name of the microcontroller 10 just has to be confirmed through communication before the microcontroller joined to the wiring board 20.

2. Embodiment 2

Figure 4:
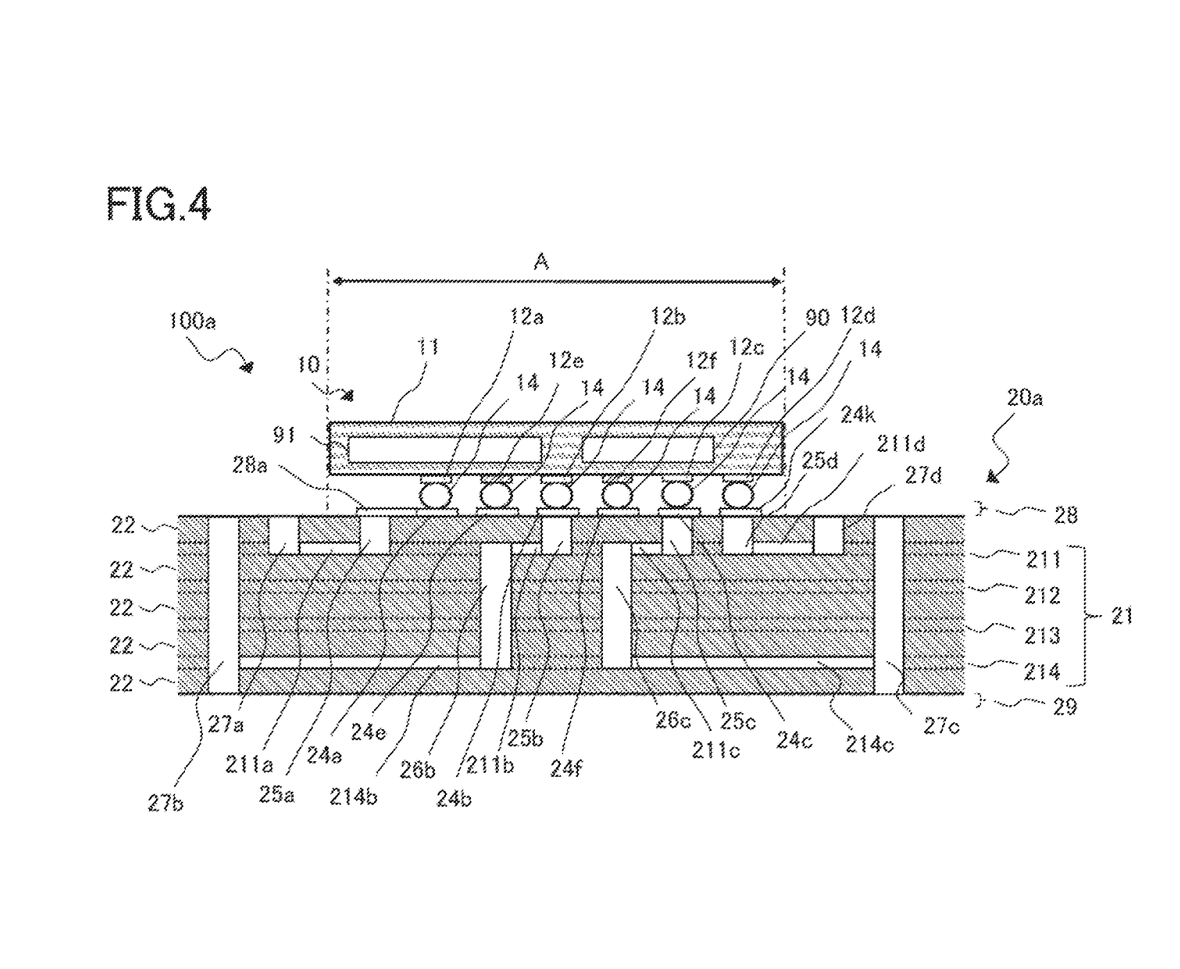
FIG. 4 is a sectional view of a control device according to Embodiment 2.

FIG. 4 is a sectional view of a control device 100a according to Embodiment 2. When it is compared with FIG. 1 according to Embodiment 1, although the same microcontroller 10 is used, the wiring board 20 was changed into a wiring board 20a.

<Connection Between Electrode Pad and Wiring Pattern Placed outside Region of Package Projected Plane>

In FIG. 1 according to Embodiment 1, the electrode pad 24d is electrically connected to the communication via 27d through the wiring pattern 28d in the front surface layer 28. With respect to a region A of a projected plane on the wiring board 20 of the package 11 of the microcontroller 10, the wiring pattern 28d extending to the outer side of that region can be visually recognized from the outside. Thus, there is a possibility that a connection point of the electrode pad 24d may be tracked visually.

In FIG. 4 according to Embodiment 2, an electrode pad 24k is electrically connected to the communication via 27d through a blind via 25d and a wiring pattern 211d. Since the electrode pad 24k is electrically connected to the communication via 27d through the wiring pattern 211d in the first intermediate layer 211, it is difficult to track the connection point visually.

In this manner, in FIG. 4, the electrode pad 24k is not connected to a portion of the wiring pattern in the front surface layer 28, said portion being outside the region A of the projected plane on the wiring board 20a of the package 11 of the micro-controller 10. Thus, it is possible to prevent the connection point of the electrode pad 24k from being tracked visually. The electrode pad. 24k is connected, inside the region A of the projected plane of the package 11, to the wiring pattern 211d in the first intermediate layer 211 through the blind via 25d as an interlayer connection portion. Further, the electrode pad 24k is electrically connected to the communication via 27d through the wiring pattern 211d. Since this connection is established through the wiring pattern 211d in the intermediate layer 21 that is not visually recognizable from the outside, it becomes more difficult to track the connection from the electrode pad 24k Thus, it is possible to increase difficulty of unauthorized access.

<Connection Between Electrode Pad and Blind Via Placed inside Region of Package Projected Plane>

In this situation, as shown in FIG. 4, inside the region A of the projected plane of the package 11 of the microcontroller 10, the electrode pad 24k is connected to the blind via 25d as an interlayer connection portion. It is desired that the interlayer connection portion here be a blind via. This is because, when inside the region A of the projected plane of the package 11, the electrode pad 24k is connected to a through-hole via that penetrates through the wiring board 20a, there is a possibility that the electrode pad 24k may be accessed from the rear surface of the wiring board 20a through the through-hole via. Thus, in the case where the electrode pad 24k is connected, inside the region A of the projected plane of the package 11, to a via as an interlayer connection portion, it is important to use as that via, not a through-hole via but a blind via. When a blind via is used inside the region A of the projected plane, as a connection point for the electrode pad 24k, it is possible to increase difficulty of unauthorized access.

<Protection against. Tracking through Communication Via>

In FIG. 1 according to Embodiment 1, electrical connection from the electrode pad 24c to the communication via 27c is established through the wiring pattern 29c in the rear surface layer 29. Thus, the connection path from the communication via 27c to the blind via 25j may be tracked according to the wiring pattern 29c.

In FIG. 4 according to Embodiment 2, electrical connection from the electrode pad 24c to the communication via 27c is changed to be established through the wiring pattern 214c in the fourth intermediate layer 214. The communication via 27c is configured not to be connected to the wiring patterns in the front surface layer 28 and the rear surface layer 29 of the wiring board. 20a. This makes it more difficult to track the connection from the communication via 27c. Namely, the communication via is electrically connected to the communication electrode through the wiring pattern in the intermediate layer, so that it is possible to increase difficulty of unauthorized access.

<Independent Communication Via>

Further, the communication vias 27a, 27b, 27c, 27d are desired not to be connected to the wiring patterns in the front surface layer 28 and the rear surface layer 29. When these communication vias are not connected to the wiring patterns in the front surface layer 28 and the rear surface layer 29, they appear as independent vias when the wiring board 20a is viewed from the outside, so that it becomes difficult to distinguish them from the other vias. Accordingly, it is possible to make it more difficult to identify the communication vias, to thereby increase difficulty of unauthorized access.

3. Embodiment 3

Figure 5:
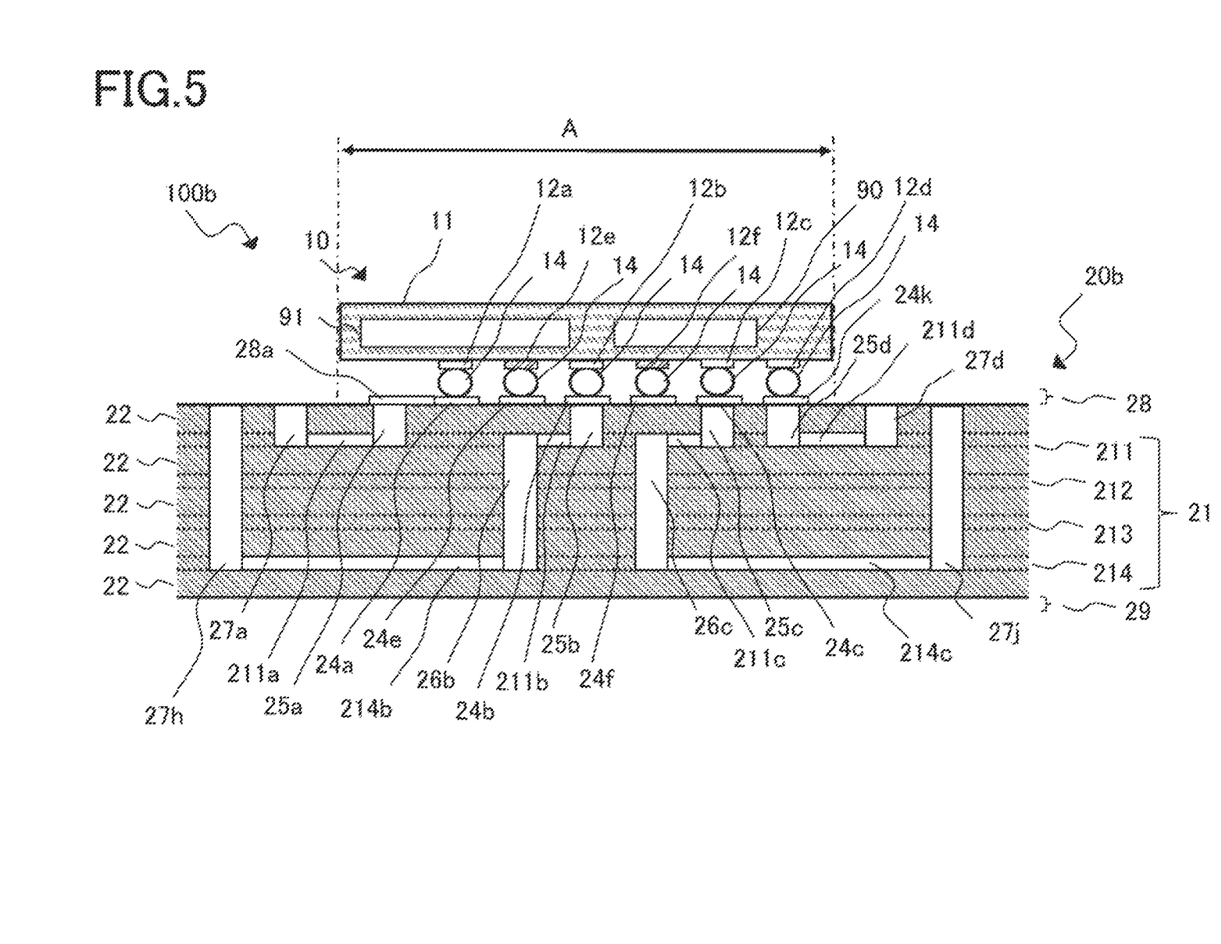
FIG. 5 is a sectional view of a control device according to Embodiment 3.

FIG. 5 is a sectional view of a control device 100b according to Embodiment 3. Here, although the same microcontroller 10 is used, the wiring board 20 according to Embodiment 1 was changed into a wiring board 20b.

<All Communication Vias Formed into Blind Vias>

In FIG. 1 according to Embodiment 1, the communication vias 27b, 27c are formed as through-hole vias. In FIG. 5 according to Embodiment 3, what differs is that all of the communication vias 27a, 27d, 27h, 27j are formed as blind vias. Accordingly, each of the communication vias 27a, 27b, 27h, 27j is externally exposed only on one of the surfaces of the wiring board 20b, so that presence cannot be visually recognized on the other surface. Thus, it is possible to make it more difficult for a third party who does not know which surface of the wiring board 20b the communication vias are each exposed on, to access these communication vias. This makes it possible to increase difficulty of unauthorized access.

4. Embodiment 4

Figure 6:
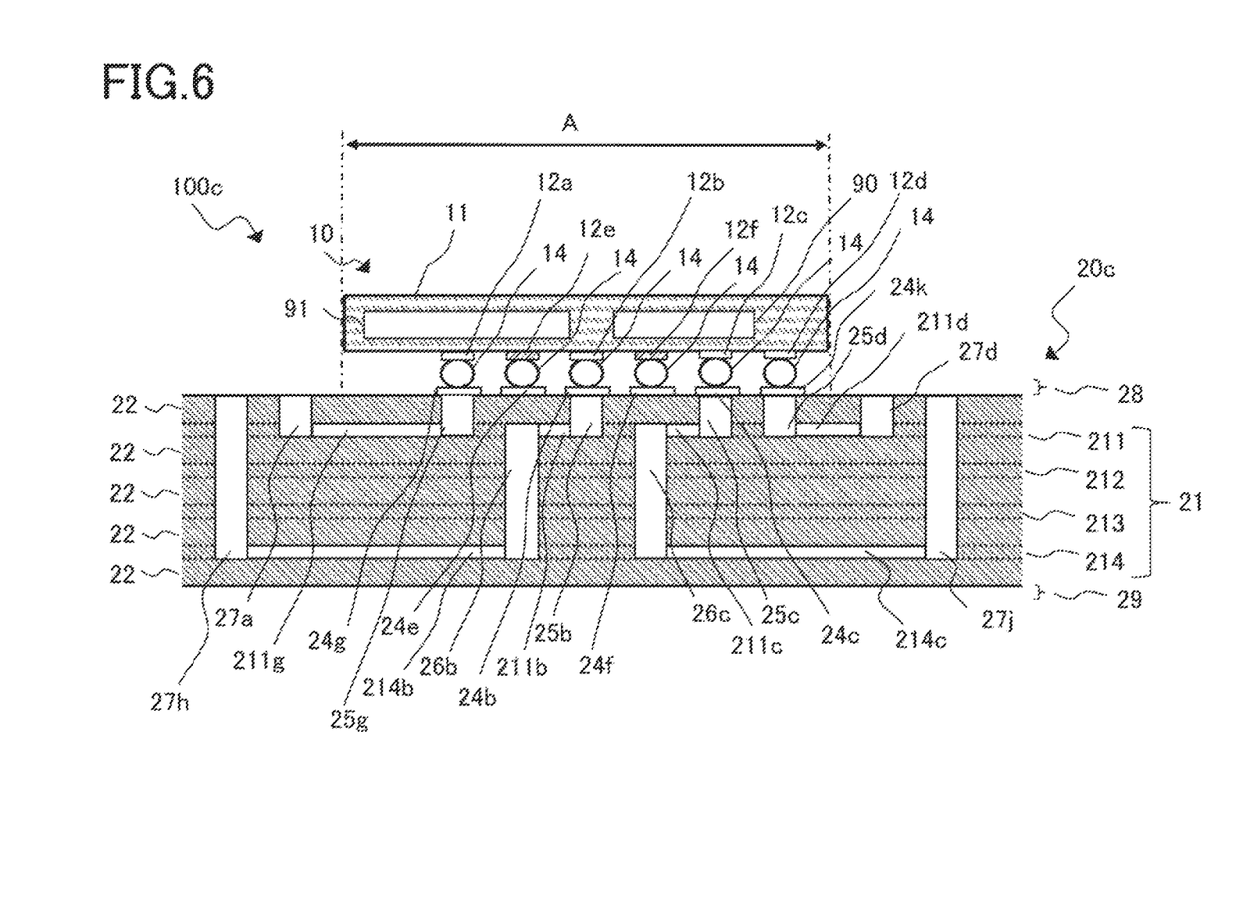
FIG. 6 is a sectional view of control device according to Embodiment 4.

FIG. 6 is a sectional view of a control device 100c according to Embodiment 4. Here, although the same microcontroller 10 used, the wiring board 20 according to Embodiment 1 was changed into a wiring board 20c.

<All Electrode Pads Formed into Pad-on-Via>

In FIG. 1 according to Embodiment the electrode pads 24b, 24c are each provided as a pad-on-via which also serves as the interlayer connection portion (via.). The electrode pads 24a, 24d are each provided as an electrode pad that is not formed commonly with a via, and are thus connected to the wiring patterns 28a, 28d. In contrast, in FIG. 6 according to Embodiment all of the electrode pads 24g, 24b, 24c, 24k are formed as pad-on vias and thus integrated with the blind vias 25g, 25b, 25c, 25d, respectively.

In this situation, the wiring pattern 28a is eliminated and a wiring pattern 211g is provided in place of the wiring pattern 211a. Further, as has been described regarding FIG. 4 according to Embodiment 2, the wiring pattern 28d is eliminated and the wiring pattern 211d is provided. The use of a lot of pad-on-vias contributes to reducing the necessary area of the wiring pattern in the front surface layer 28. This enhances the design flexibility of the wiring pattern in the front surface layer 28 of the wiring board 20c. As a result, it is possible to reduce the area of the wiring board 20c to thereby contribute to reduction in size, weight and cost of the control device 100c.

5. Embodiment 5

Figure 7:
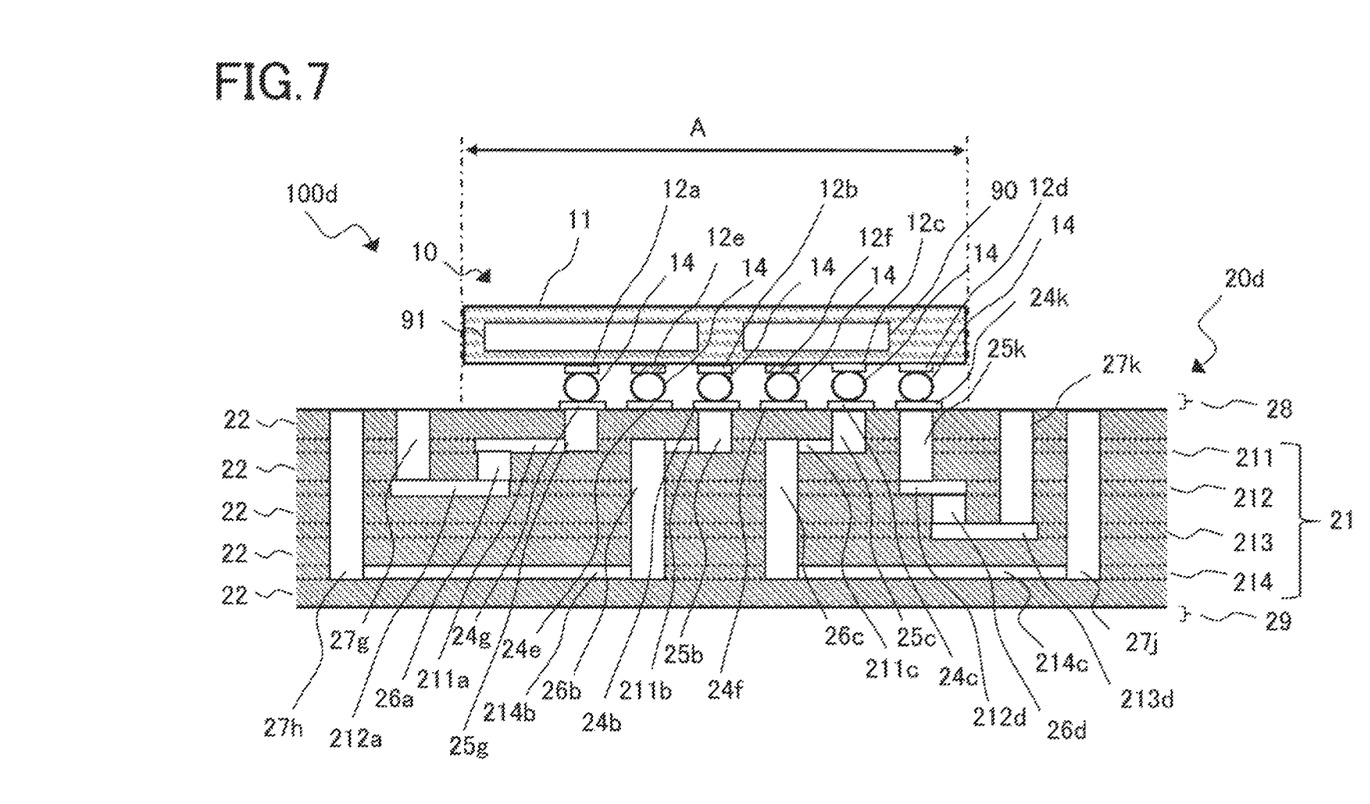
FIG. 7 is a sectional view of a control device according to Embodiment 5.

FIG. 7 is a sectional view of a control device 100d according to Embodiment 5. Here, although the same microcontroller 10 is used, the wiring board 20 according to Embodiment 1 was changed into a wiring board 20d.

<Use of Buried Via>

In FIG. 7 according to Embodiment 5, the electrode pads 24g, 24b, 24c, 24k are electrically connected to the communication vias 27g, 27h, 27j, 27k, respectively, through buried vias 26a, 26b, 26c, 26d each making electrical connection only between the intermediate layers. Accordingly, there are provided wiring patterns 212a, 212d, 213d, a blind via 25k, and the like. In this manner, electrical connections to the communication vias 27g, 27h, 27j, 27k are established through the buried vias 26a, 26b, 26c, 26d, so that it is possible to make it difficult to track such wiring connections even the wiring board 20d has been analyzed. This makes it more difficult for a third party to access the communication vies, to thereby prevent unauthorized access.

In this application, variety of exemplary embodiments and examples are described; however, every characteristic, configuration or function that is described in one or multiple embodiments, is not limited to being applied to a specific embodiment, and may be applied singularly or i.n any of various combinations thereof to another embodiment. Accordingly, an infinite number of modified examples that are not exemplified here are supposed within the technical scope disclosed in the present description. For example, such cases shall be included where at least one configuration element is modified; where any configuration element is added or omitted; and furthermore, where at least one configuration element is extracted and combined with a configuration element of another embodiment.

What is claimed is:

1. A control device, comprising:
a microcontroller having, a storage device; a processor for processing information on a basis of a program stored in the storage device; a package in which the storage device and the processor are accommodated; and multiple communication electrodes which are provided on bottom surface of the package, for allowing access from an outside of the package to the storage device; and
a wiring board having, wiring layers which are comprised of front surface layer, an intermediate layer and a rear surface layer, each having a wiring pattern formed therein; insulating members for insulating the respective wiring layers from each other; interlayer connection portions each making an electrical connection between the wiring pattern and the other wiring pattern in different ones of the wiring layers; multiple electrode pads which are formed in the front surface layer and to which the respective communication electrodes of the microcontroller are connected; and communication-dedicated interlayer connection portions which are electrically connected, each through the wiring pattern, to the respective electrode pads, which are located to be spaced apart from each other, and which are each externally exposed on at least one of front and rear surfaces of the wiring board.

2. The control device of claim 1, wherein, in the wiring board, the communication-dedicated interlayer connection portions are electrically connected, each through the wiring pattern in the intermediate layer, to the electrode pads.

3. The control device of claim 2, wherein, in the wiring board, the communication-dedicated interlayer connection portions are disconnected from the wiring patterns in the front surface layer and the rear surface layer.

4. The control device of claim 1, wherein, in the wiring board, at least one of the communication-dedicated interlayer connection portions is a blind via which is insulated, through the insulating member, from at least one of the wiring layers.

5. The control device of claim 4, wherein, in the wiring board, every one of the communication-dedicated interlayer connection portions is the blind via which is insulated, through the insulating member, from at least one of the wiring layers.

6. The control device of claim 1, wherein, in the wiring board, the electrode pads are disconnected from a portion of the wiring pattern in the front surface layer, said portion being in a region outside a projected plane of the package of the microcontroller on that board, and they are each electrically connected, in a region inside the projected plane of the package, to the wiring pattern in the intermediate layer, through the interlayer connection portion.

7. The control device of claim 6, wherein, in the wiring board, the interlayer connection portion through which the electrode pad is connected in the region inside the projected plane of the package of the microcontroller, is a blind via which is insulated, through the insulating member, from at least one of the wiring layers.

8. The control device of claim 1, wherein the package of the microcontroller is provided with indication of an encrypted type name.

9. The control device of claim 1, wherein the package of the microcontroller is provided with indication of a type name which has been processed into an unreadable state.

10. The control device of claim 9, wherein the package of the microcontroller is provided with the indication of type name which has been processed by laser-processing into an unreadable state.

11. The control device of claim 1, wherein the wiring board has at least three said communication-dedicated interlayer connection portions.

12. The control device of claim 1, wherein, in the wiring board, at least one of the electrode pads is provided as a pad-on-via which also serves as the interlayer connection portion.

13. The control device of claim 12, wherein, in the wiring board, every one of the electrode pads is provided as the pad-on-via which also serves as the interlayer connection portion.

14. The control device of claim 1, wherein the wiring board has the wiring layers which are comprised of the front surface layer, multiple intermediate layers each being said intermediate layer, and the rear surface layer, each having the wiring pattern formed therein; and wherein the electrode pads are electrically connected to the communication-dedicated interlayer connection portions through respective buried vias which are the interlayer connection portions each making electrical connection only between the intermediate layers.

15. A manufacturing method of a control device, comprising:
preparing a microcontroller having, a storage device; a processor for processing information on a basis of a program stored in the storage device; a package which is provided with indication of a type name and in which the storage device and the processor are accommodated; and multiple communication electrodes which are provided on a bottom surface of the package, for allowing access from an outside of the package to the storage device;
preparing a wiring board having, wiring layers which are comprised of a front surface layer, an intermediate layer and a rear surface layer, each having a wiring pattern formed therein; insulating members for insulating the respective wiring layers from each other; interlayer connection portions each making an electrical connection between the wiring pattern and the other wiring pattern in different ones of the wiring layers; multiple electrode pads which are formed in the front surface layer and to which the respective communication electrodes of the microcontroller are to be connected; and communication-dedicated interlayer connection portions which are electrically connected, each through the wiring pattern, to the respective electrode pads, which are located to be spaced apart from each other, and which are each externally exposed on at least one of front and rear surfaces of the wiring board;
joining the microcontroller to the wiring board; and
processing the indication of the type name on the package of the microcontroller, into an unreadable state.

16. The manufacturing method of a control device of claim 15, wherein, the indication of the type name is processed into the unreadable state by laser processing.

* * * * *